(12) United States Patent
Perner

(10) Patent No.: US 7,202,545 B2
(45) Date of Patent: Apr. 10, 2007

(54) MEMORY MODULE AND METHOD FOR OPERATING A MEMORY MODULE

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 10/928,708

(22) Filed: Aug. 27, 2004

(65) Prior Publication Data

US 2005/0098881 A1 May 12, 2005

(30) Foreign Application Priority Data

Aug. 28, 2003 (DE) ................. 103 39 787

(51) Int. Cl.
*H01L 29/00* (2006.01)

(52) U.S. Cl. .............. 257/499; 257/678; 257/690; 257/723; 257/730

(58) Field of Classification Search ............... None
See application file for complete search history.

(56) References Cited

U.S. PATENT DOCUMENTS

| | | |
|---|---|---|
| 5,243,703 A | 9/1993 | Farmwald et al. |
| 5,357,621 A | 10/1994 | Cox |
| 5,859,809 A | 1/1999 | Kim |
| 6,144,576 A * | 11/2000 | Leddige et al. ............ 365/63 |

* cited by examiner

*Primary Examiner*—Wai-Sing Louie
(74) *Attorney, Agent, or Firm*—Slater & Matsil, L.L.P.

(57) ABSTRACT

A memory module has an electronic printed circuit board and a plurality of semiconductor memory chips. A series circuit of the semiconductor memory chips is formed with the aid of two leads that can be driven by external contacts of the printed circuit board, and with the aid of connection lines between in each case two semiconductor memory chips. By means of the series circuit, individual semiconductor memory chips can be driven selectively with respect to the rest of the semiconductor memory chips without having to interrupt the regular data transport via the address and control lines. During normal memory operation, chip-specific test data or other data can be interrogated and be read out via an electric loop formed between the further external contacts.

14 Claims, 4 Drawing Sheets

|    | n=1 | n=2 | n=3 | n=4 |
|----|-----|-----|-----|-----|
| t1 | K0  | K0  | K0  | K0  |
| t2 | K1  | K0  | K0  | K0  |
| t3 | K0  | K2  | K0  | K0  |
| t4 | K0  | K0  | K3  | K0  |
| t5 | K0  | K0  | K0  | K4  |

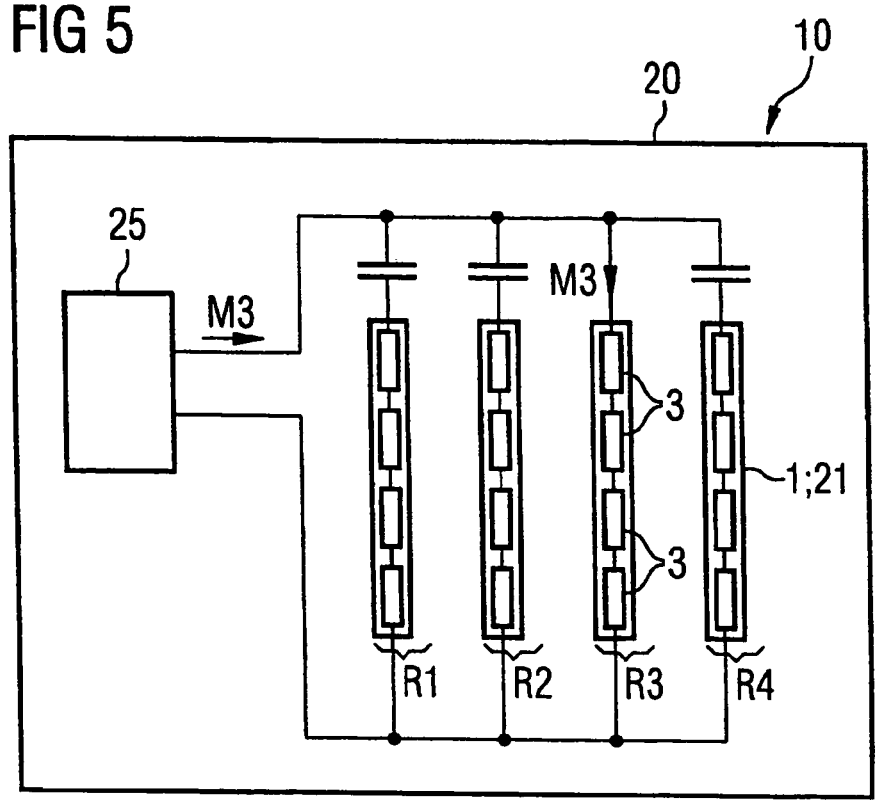
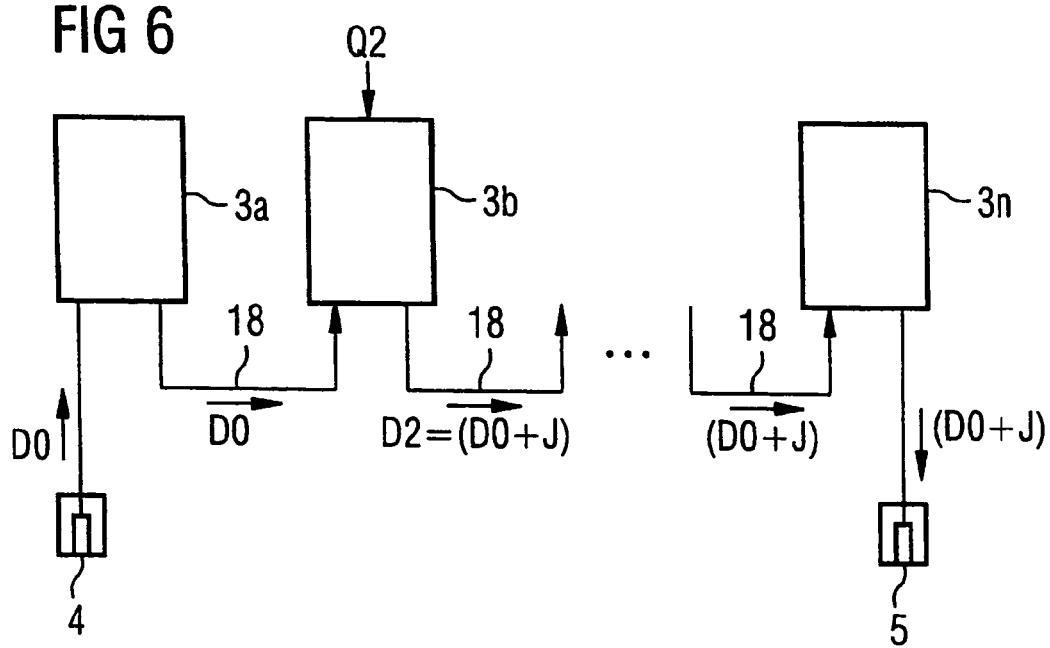

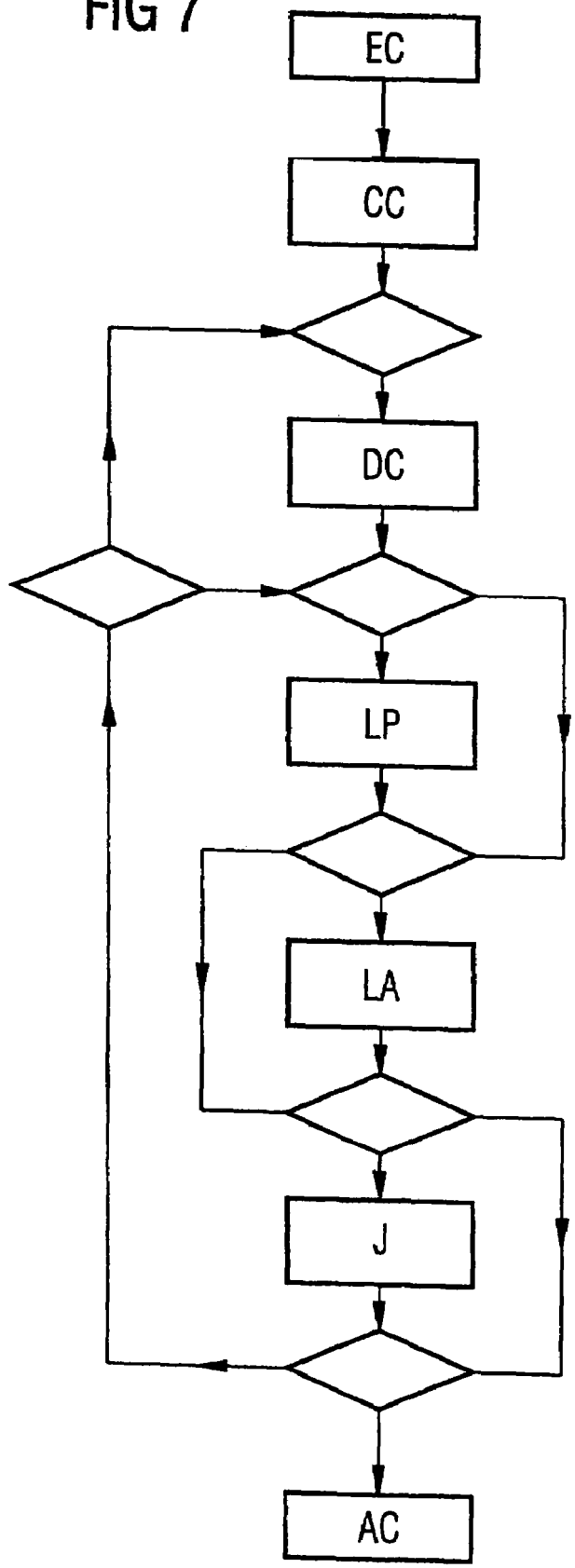

MEMORY MODULE AND METHOD FOR OPERATING A MEMORY MODULE

This application claims priority to German Patent Application 103 39 787.6, which was filed Aug. 28, 2003 and is incorporated herein by reference.

TECHNICAL FIELD

The present invention relates generally to a memory module, and more particularly to a system and method for operating a memory module having an electronic printed circuit board and a plurality of semiconductor memory chips.

BACKGROUND

A memory module is a system, typically on a single circuit board, that includes a number of memory chips. Memory modules are often configured to include data lines that are divided so that any one or group of ones of data lines will access the memory chips, such as DRAMs (dynamic random access memory), individually for transferring memory data. The module can also include further lines, called first lines hereinafter, that simultaneously access all the semiconductor memory chips and, therefore, connect the latter to one another in parallel. Such first lines are, by way of example, address lines for communicating memory addresses and also control lines for communicating control commands such as reading, writing, activation or deactivation of memory cells.

On account of the parallel interconnection, each semiconductor memory chip receives the same command sequence. Only the memory contents that are communicated via the data lines leading to in each case only a single semiconductor memory chip are transferred in chip-specific fashion.

If an individual memory chip is intended to be selectively addressed, for example in order to read chip-specific data, conventionally the normal memory operation is interrupted and a special operating mode of the memory module is set, in which, for instance, chip-specific data such as test results of a chip test or the former position of the memory chip within a wafer or the batch number of the wafer that was processed in order to fabricate the memory chip are transferred. Such information is still of importance even after start-up of a memory module, in order, in the event of error clusters, to identify the identity of the error-susceptible semiconductor chips affected during fabrication in semiconductor memory chips of a multiplicity of produced memory modules. Such data are usually stored in the form of electrically one-time blowable fuses on each semiconductor chip and can later be retrieved at any point in time, but not during the normal operation of a memory module. One reason for this is that the control lines required for transferring such individual chip data, during the operation of a memory module, are already required for communicating control commands such as writing, reading, etc., or for transferring commands such as chip select, row address strobe, column address strobe, write enable, clock or clock enable and are not available for further operations. Any interrogation of chip-specific data would thus result in an interruption of the module operation.

Module-specific data containing chip-specific data can also be stored on a customary EEPROM (electrically erasable programmable read only memory) present in the memory module. However, the capacity thereof is often limited. Moreover, its content is predetermined from the outset for each repeated instance of starting operation. By way of example, the number of semiconductor memory chips and their memory capacity are stored in the EEPROM. This chip is not suitable for storing or retrieving more extensive, in particular variable, data.

Chip-specific data consequently have to be stored or retrieved via the first lines that are required during the normal operation of the memory module.

There are principally two types of memory modules that are customary, which differ with regard to their driving when a plurality of memory modules are used in memory slots of a superordinate memory unit. In a memory arrangement whose main board has a plurality of module slots fitted with memory modules, each semiconductor memory chip of each memory module must be addressable selectively with respect to the rest of the semiconductor memory chips, at least in order to write or read memory data during normal memory operation.

In the case of SDRAMs (synchronous dynamic random access memory), the memory chips of a single memory module are in each case connected in parallel, so that all the memory chips are in each case accessed simultaneously. For the selection of a specific memory module or module slot (or a specific module side in the case of two-bank modules), use is made of a signal "chip select" on the main board, as a result of which in each case all the memory chips of a specific memory module are driven simultaneously. The data exchange is effected synchronously, i.e., at regular time intervals that are oriented to the clock signal and amount to a multiple of the clock cycle time. In the event of all the memory chips of the memory module being accessed in parallel, the bus width of the module results from the bus width of a memory chip times the number of memory chips connected in parallel, in which case in some instances an additional semiconductor memory chip is additionally connected in parallel for the purpose of error correction. A distinction is made between SDR-SDRAMs (single data rate) and DDR-SDRAMs (double data rate) depending on whether only the rising or both the rising and the falling clock edges of the clock signal are utilized for data transfer.

On the main board, the memory modules are likewise connected in parallel with one another. The signal "chip select" serves for driving a specific memory module, as a result of which the data bus of in each case a single memory module is selected. The chip select signal limits the parallelism of the driving; as a result, all the memory chips of only a single memory module are driven in parallel with one another.

In the case of SDRAMs, the abovementioned chip-specific driving is not possible at least during the normal memory operation. This is already unsuccessful due to the module-internal connection in parallel of all the semiconductor memory chips.

The memory modules of the other design are called RDRAMs, named after the provider Rambus. In the case of the Rambus system, a plurality of memory modules that are inserted into module slots of a main board are connected in series. During the so-called initialization of a memory module or the totality of a plurality of memory modules, each memory chip receives a chip-specific memory identifier. This daisy chain initialization enables a direct driving of a specific memory chip. In this case, too, the memory chips of a memory module are connected in parallel with one another. Use is made of a data bus that has 16 data lines, for example, and is rather narrow in comparison with SDRAMs. For example, the data bus transports data blocks within 4 clock times (in a "burst 8 mode" in the case of DDR- SDRAMs). During the operation of an RDRAM, the data sent to a memory module are simultaneously transported to all the memory chips of the module. However, the processing or taking-up of the data occurs only in the addressed memory chip. The rest of the memory chips "eavesdrop" in this time but do not react actively.

Thus, in the case of RDRAMs, the chip-specific driving is effected via the control lines, to be precise exclusively for the purpose of storing and interrogating memory data. If the intention is additionally to interrogate chip-specific data, for instance test data of previous memory tests, the normal operation has to be interrupted. Furthermore, there is the major disadvantage that when a specific memory chip is being driven, the rest of the memory chips of the same module are paralyzed since they cannot be driven simultaneously via the same data bus of the memory module. In the case where a plurality of RDRAMs are cascaded on a main board, the further disadvantage arises that empty module slots that are not occupied have to be occupied by bridging modules because otherwise the temporal coordination of the data exchange collapses.

SUMMARY OF THE INVENTION

In one aspect, the invention relates to a memory module having an electronic printed circuit board and having a plurality of semiconductor memory chips, lines that can be driven electrically via first external contacts of the printed circuit board branching toward the semiconductor chips and thereby connecting the semiconductor chips in parallel with one another. The invention furthermore relates to a method for operating a memory module.

The preferred embodiment of the present invention provides a memory module, as well as a method for operating a memory module, in which it is possible to selectively drive individual semiconductor memory chips without interrupting the normal memory operation. For example, an individual chip can be selected while another is being interrogated chip-specific information that is not regularly required. Furthermore, in preferred embodiments, a new type of data transport is enabled within a memory module and also within an arrangement of a plurality of memory modules, in the case of which a plurality of semiconductor memory chips can be addressed in turn. The intention is for this progressive addressing of a plurality of semiconductor memory chips to be made possible in particular by means of a single, one-time instruction.

With regard to the memory module, this object is achieved according to the invention by virtue of the fact that a first connecting line, which can be driven electrically via a second external contact of the printed circuit board and leads to a first semiconductor memory chip, and a second connecting line, which can be read out via a third external contact of the printed circuit board and leads to a last semiconductor memory chip, and also at least one connection line leading from one respective semiconductor memory chip to another respective semiconductor memory chip are provided, the semiconductor memory chips being connected by the two connecting lines and by the at least one connection line to form a series circuit between the second and the third external contact of the printed circuit board.

According to one aspect of the invention, an electrical loop into which all the semiconductor memory chips are interposed is provided between two external contacts of the printed circuit board of a memory module. Connection lines lead from one respective semiconductor memory chip to the next; consequently, a direct connection or branching-off from these intermediate lines to an external contact does not exist. Such an interconnection is not customary in memory modules in which all the memory chips are jointly connected to the same external contacts of the printed circuit board via lines that branch like a phylogenetic tree.

In view of the equivalence of the semiconductor memory chips among one another, it initially appears to be absurd to connect two of the semiconductor memory chips, i.e., a first and a last, directly to electrical external contacts, while the rest of the semiconductor memory chips have lines that only lead to adjacent memory chips but have no connection to any external contact. According to the preferred embodiment, however, the series circuit formed with the aid of the connection lines described above is interposed as an electrical loop between two external contacts of the printed circuit board.

Such an electrical loop that traverses one semiconductor memory chip after the other starting from an external contact or from a buffer chip connected thereto on the printed circuit board and at the end returns again to a further external contact or buffer chip does not correspond to the principle—familiar from customary module printed circuit boards—of permitting a line proceeding from an external contact to end at one semiconductor memory chip (as in the case of data lines) or, in the case of branching like a phylogenetic tree, at a plurality or all of the semiconductor memory chips (as in the case of address lines or control lines). Both SDRAM and RDRAM printed circuit boards have a phylogenetic tree-like or comb-like interconnection of all the memory chips which are in each case situated at the line ends.

According to the preferred embodiment of the present invention, by contrast, the above-mentioned interconnection, which represents a loop drawn through the memory module, is utilized for a new type of memory driving. Although the electrical loop that traverses all the memory chips in turn without preferring a specific memory chip does not appear a priori to enable a chip-selective driving of individual memory chips, it is entirely possible, according to the invention, for specific memory modules to be driven selectively when the data that pass via the electrical loop or in some other way to the memory chips contain memory-module-specific information. Even if each memory chip processes the data obtained via the electrical loop, the way in which this processing occurs can be influenced in a chip-specific manner with the aid of the data themselves or with the aid of some other driving of individual memory chips. This makes it possible that, within the chain of memory chips, an individual memory chip processes the data obtained via the electrical loop differently than the rest of the memory chips, so that, at the end of the chain, a data signal specific to the relevant memory chip is output to the external contact at the end of the electrical loop. This chip-specific data signal can therefore be assigned to the relevant memory chip and transport chip-specific information without disturbing the conventional parallel operation on the memory module. In this way, both SDRAM and RDRAM memory modules can be equipped for retrieving chip-specific additional information at any time.

A preferred embodiment provides for the series circuit to be formed in such a way that data sent to the first semiconductor memory chip via the second external contact are forwarded in temporally offset fashion via the connection lines to the respective next semiconductor memory chip of the series circuit. In this case, the electrical loop between the second and third external contacts is exclusively set up for unidirectional data transport; the data that have been originally input or have been altered by one of the memory chips are forwarded via the connection lines to the next memory chip in temporally offset fashion. The temporal offset between the data transport of two connection lines connected to the same memory chip is preferably chosen to be very large in comparison with the clock cycle time, in order to enable even complex interrogations, for example of extensive test data, in the memory chips.

It is preferably provided that a third connecting line, which can be driven via a fourth external contact of the printed circuit board and connects the semiconductor memory chips in parallel with one another, is provided, by means of which the semiconductor memory chips can be activated with the aid of individual memory identifiers in each case individually selectively with respect to further semiconductor memory chips. In this case, the selection of a specific memory chip is not effected with the aid of the data communicated via the electrical loop, but rather with the aid of an additional selection signal that is sent to all the semiconductor memory chips but addresses only one memory chip on account of its chip-specific identifier. As a result, in the chip, a processing process is activated that leads to the outputting, inputting or transformation of the desired chip-specific information.

It is preferably provided that exclusively those semiconductor memory chips which are selectively activated with the aid of the third connecting line are caused to alter or to supplement data received via the series circuit prior to a forwarding to the respective next semiconductor memory chip. In the case of this embodiment, the non-selected memory chips are configured in such a way that they only serve for the temporally offset forwarding of the data flowing via the electrical loop, without changing the data themselves, at least not with regard to their relevant content. By contrast, the selected memory chip processes the incoming data and forwards changed data, preferably supplemented by a chip-specific data addition, to the connection lines to the next semiconductor memory chip. These information items are read out via the third external contact and evaluated on a main board.

It is preferably provided that the memory module is formed in such a way that, in the event of a start-up of the memory module, each semiconductor memory chip of the series circuit is assigned an individual memory identifier corresponding to a consecutive number of the respective semiconductor memory chip within the series circuit. In the case of this particular embodiment, not just one but each semiconductor memory chip is caused to alter or to supplement the data arriving at the chip via the respective connection line. In this case, the number of changes or supplementations may be used to convey to the main board information about the total number of connected memory chips of one or a plurality of memory modules. Equally, this embodiment may be used to assign to each memory chip a chip-specific memory identifier, which can later be used after commissioning of the memory module for chip-selective driving. These types of initialization have the advantage over memory identifiers that are burned into the chips with the aid of laser fuses or electrical fuses that, upon each commissioning of the memory module, can be established and assigned anew and be automatically adapted in the case of changes in the meantime to the fitting of the memory module with memory chips or of a main board with memory modules.

It is preferably provided that the memory module is formed in such a way that, in the event of each start-up of the memory module, each semiconductor memory chip that receives, via the series circuit, a memory identifier corresponding to its consecutive number within the series circuit outputs to the connection line to the respective next semiconductor memory chip or to the second connecting line a memory identifier corresponding to the next higher consecutive number of a semiconductor memory chip. The signal output to the third external contact at the end of the series circuit thus directly reproduces the total number of memory chips used or, as an alternative thereto, a quantitative indication of the total available memory capacity.

It is preferably provided that the lines that can be driven via the first external contacts are address lines and control lines. Memory addresses in all the semiconductor memory chips are addressed simultaneously with the aid of the address lines; the control lines serve for communicating write, read and further commands.

The semiconductor memory chips preferably contain volatile random access memories, in particular DRAMs.

Finally, it is provided that the first external contacts and the second and the third external contacts are arranged in a common contact strip of the printed circuit board.

A memory module according to embodiments of the invention is likewise used to develop a memory module arrangement having a main board having a plurality of module slots, a memory module according to one of the embodiments described above being connected to one or to a plurality of module slots, and each module slot having two contacts for connecting a series circuit of semiconductor memory chips on both sides.

The memory module according to the invention enables a novel interconnection of a plurality of memory module slots of a main board; on account of the series circuits that in each case traverse a memory module in loop-type fashion, series circuits of all the semiconductor memory chips of all the module slots can be formed with the aid of the, in each case, two contacts per module slot. The resultant overall chain of memory chips is suitable for counting up and individually identifying all the memory chips in accordance with their total number on the main board; as a result, even after a rearrangement or exchange of memory modules, the main board recognizes each change with regard to the number or the memory capacity of the memory chips and thereby enables remote access controls which manage without actively instigated parameter changes.

One embodiment provides for the main board to be constructed in such a way that the semiconductor memory chips of all the memory modules connected to the module slots are connected to form a single series circuit via the two respective contacts of the module slots. In this case, connection lines of the main board connect two contacts of mutually adjacent module slots.

A further embodiment provides for the main board to be constructed in such a way that, with the aid of a module identifier, a respective series circuit of semiconductor memory chips of a memory module can be driven selectively with respect to series circuits of semiconductor memory chips of further memory modules. In this case, the memory modules or module slots are connected in parallel with one another and are selectively driven with the aid of a chip select signal. The further selection—not possible during operation in the case of conventional memory modules—with regard to an individual semiconductor memory chip is effected with the aid of the above-described series circuit traversing the memory module in loop-type fashion.

Aspects of the invention furthermore relate to a method for operating a memory module having a series circuit having a plurality of semiconductor memory chips that are connected in series on a printed circuit board between two external contacts of the printed circuit board. According to the invention, data are conducted via one of the two external contacts to a first semiconductor memory chip and via connection lines in each case in temporally offset fashion from one semiconductor chip to a next semiconductor chip and from a last semiconductor memory chip to the second of the two external contacts. By virtue of this type of data transport through all the semiconductor memory chips back to an external contact again, it is possible to implement the electrical loop for progressively transferring data provided to the respective next semiconductor memory chip and—in the case of a selected semiconductor chip—with the data being altered. In this case, the data transport is effected from the first to the last semiconductor memory chip without a feedback of the memory chips arranged in the center of the series circuit to one of the external contacts of the printed circuit board, by means of which the semiconductor memory chips are conventionally driven in the case of SDRAMs and also RDRAMs; the exclusive forwarding of data, if appropriate after the latter have been changed or supplemented, via connection lines between, in each case, two memory chips without any feedback with a main board makes it possible to utilize a new type of data transport for memory modules.

In a preferred type of embodiment, it is provided that with the aid of an individual memory identifier, an individual semiconductor memory chip is caused, selectively with respect to the rest of the semiconductor memory chips to alter or to supplement data received via the series circuit prior to the forwarding to the respective next semiconductor memory chip.

It is preferably provided that in the event of start-up of the memory module, each of the semiconductor memory chips connected in series is assigned an individual memory identifier corresponding to a consecutive number of the respective memory chip within the series circuit, the memory identifiers being retained only during the operation of the memory module. The erasure of the assigned memory identifiers when the memory module or a main board is switched off has the advantage that, even after a rearrangement or alteration of memory modules in module slots of a main board, upon later turn-on, the electrical loops through the memory modules together reproduce the changed memory configuration in the form of altered memory identifiers, without this necessitating an intervention externally, for example an active parameter adaptation.

It is preferably provided that with the aid of the series circuits, information items are read selectively from a semiconductor memory chip or are written thereto by virtue of the memory chip being instructed with the aid of its memory identifier, as the only one of the semiconductor memory chips connected in series, to alter or to supplement data that are conducted from the first of the two external contacts via the semiconductor memory chips to the second of the two external contacts. The rest of the memory chips in this case serve only for the time-delayed forwarding of the data, but without changing them. Unlike in RDRAM memory modules, the time delay is not prescribed by external conditions.

BRIEF DESCRIPTION OF THE DRAWINGS

The invention is explained below with reference to FIGS. 1 to 7, in which:

FIG. 5 shows a memory module arrangement according to the invention in accordance with a further embodiment;

FIG. 6 shows a schematic illustration of the data transported in the series circuit from FIG. 2; and FIG. 7 shows an example of a flowchart which describes the type and the order of access to the semiconductor memory chips of the series circuit.

DETAILED DESCRIPTION OF ILLUSTRATIVE EMBODIMENTS

Figure 1:
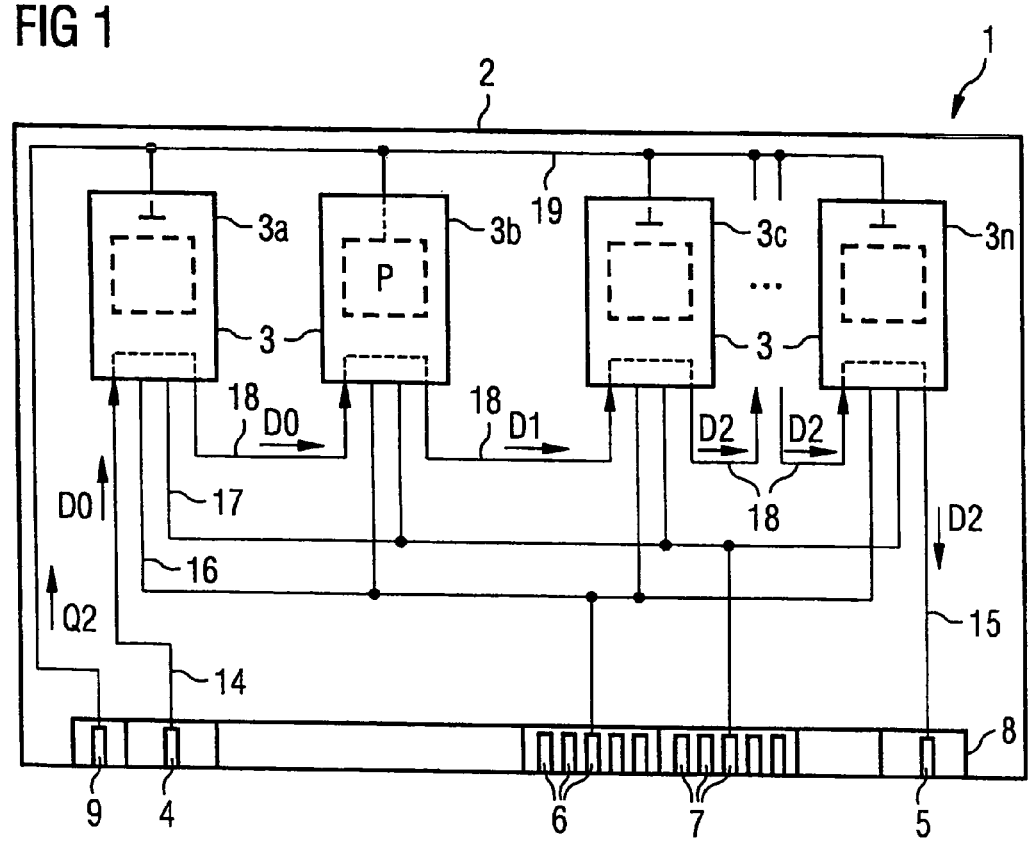
FIG. 1 shows a schematic plan view of a memory module according to the invention.

FIG. 1 shows a memory module 1 according to the preferred embodiment of the invention. A plurality of semiconductor memory chips 3 (labeled 3a, 3b, 3c, ..., 3n) are arranged on the printed circuit board 2 of the memory module. They are connected to first external terminals 6, 7 of the printed circuit board 2 in a conventional manner in parallel with one another via address lines 16 and control lines 17—if appropriate via interposed buffer memories or buffer chips ("buffers"). FIG. 1 illustrates in each case only one address line 16 and control line 17 branching like a phylogenetic tree or in a comb-like manner from an address line contact 6 and control line contact 7, respectively. In practice, an entire bus of corresponding lines will be provided.

According to the preferred embodiment, the memory module 1 has a series circuit of semiconductor memory chips 3 that are electrically connected between a second external contact 4 and a third external contact 5 of the printed circuit board 2 (or between buffer memories or buffer chips connected to the external contacts) and thus form an electrical loop. Along the electrical loop, data D0 can be conducted from the second external contact 4 to a first semiconductor memory chip 3a, from the latter via connection lines 18 to further, respectively next connected semiconductor memory chips 3b, 3c, ..., and finally to a last semiconductor memory chip 3n, from which they can be fed via a second connecting line 15 and the third external contact 5 to a main board to which the memory module 1 can be connected. The first and second connecting lines 14 and 15 are equivalent to one another, in which case, when the circuit is operated unidirectionally, one lead 14 represents an input line and the other lead 15 represents an output line of the memory module. In between, in the direction of the arrows illustrated, data D0 are transported along the chain of memory chips 3, individual memory chips 3b that are selected selectively with respect to the rest of the memory chips 3a, 3c, ... 3n, for example with the aid of a chip-specific memory identifier Q2, being caused to change or to supplement the received data D0 and to forward the changed or supplemented data D2 to the downstream chain of connected memory chips 3c, ..., 3n. The non-selected memory chips 3a, 3c, ..., 3n, which do not react to the chip-specific memory identifier Q2 respectively selected, do not alter the contents of the data D2 provided via the connection lines 18, so that chip-specific information and also that chip to which they are assigned can be read from the data that can be read out at the third external contact 5.

The chip-specific memory identifier Q2 may be provided either via the electrical series circuit between the external contacts 4, 5 or via an additional line 19 that drives the semiconductor memories in parallel. In the addressed memory chip 3b, a process P is activated which ensures that the data D0 received via the electrical loop are not simply forwarded, but rather are processed, i.e., stored, utilized for forwarding further information D2 or converted or supplemented. In both cases, the selective driving of a specific semiconductor memory chip 3b is not effected via the parallel-branched control lines 17 or address lines 16 that are always fully utilized during normal memory operation. Consequently, the memory operation need not be interrupted in order in the meantime to interrogate additional information, for instance test data or other chip-specific information.

The electrical loop between the external contacts 4, 5 primarily enables arbitrary data to be passed on from a respective semiconductor memory chip 3 to a next chip in an ordered sequence, it being possible, in principle, to read out tabular accumulations of chip-specific data of all the semiconductor memory chips 3 or else to a carry out computation operations dependent on the total number of semiconductor memory chips 3, such as, for instance, an initialization based on the position of a semiconductor memory within the series circuit. The information output by all the semiconductor memory chips 3 requires only a single output line 15, which, just like the input line 4, requires only a single external contact 5 in the contact strip 8. Even though in reality the leads 14, 15 and the connection lines 18 are embodied as a line bus in each case having a plurality of lines running parallel to one another, the electrical loop with series-connected semiconductor memory chips 3 that is used according to the invention manages with an extremely small number of additional external contacts.

Figure 2:
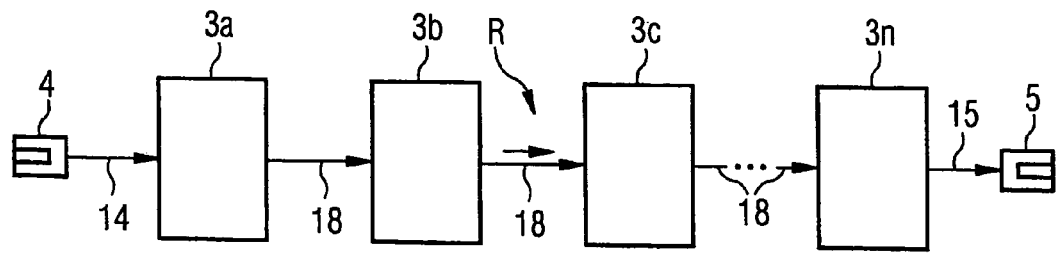
FIG. 2 shows a schematic illustration of the series circuit of semiconductor memory chips of the memory module from FIG. 1.

FIG. 2 schematically shows a series circuit R formed by the electrical loop between the external contacts 4, 5. The first lead 14 that can be driven electrically by the second external contact 4 leads to a first semiconductor memory chip 3a, from there via connection lines 18 to further chips 3b, 3c, . . . , and finally to a last semiconductor memory chip 3n, from where it can be read out via the second lead 15 by means of the third external terminal, an output terminal. The preferably unidirectional data transport is effected as illustrated in the arrow direction from left to right, i.e., from the second 4 to the third output terminal 5.

Figure 3:
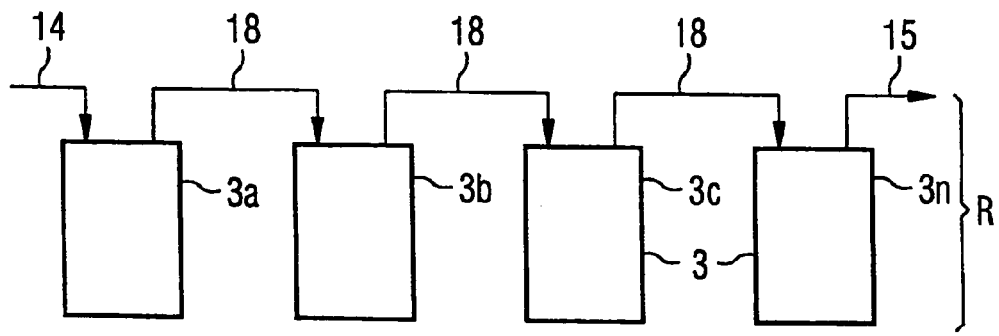
FIG. 3 shows a schematic-tabular listing of characteristic data of a plurality of successive semiconductor memory chips at different instants.

Such a series circuit R can be used according to the invention to assign to each semiconductor memory chip an individual memory identifier corresponding to its consecutive number. For this purpose, in accordance with FIG. 3, characteristic data K0 are conducted via the first lead 14 to a first memory chip 3a, which characteristic data are initially forwarded to all the downstream memory chips 3 via the connection lines 18 over a relatively long period of time up to the time t1, each connection line 18 causing a predetermined or variable temporal offset. At the instant t1, the first memory chip 3a receives for the first time a signal which causes the memory chip 3a to output at the time t2, to the connection line 18 a memory identifier K1 corresponding to its consecutive number "one". At the instant t2, the rest of the memory chips also pass on the original signal K0, as illustrated in tabular fashion in FIG. 3. The memory identifiers output in the table change with each time interval in an adjacent, further memory chip. At the instant t3, the first memory chip 3a again outputs its memory identifier K0, but in the meantime the next memory chip 3d has received the previous identifier K1 and, as a reaction thereto, outputs its own memory identifier K2 corresponding to its consecutive number "two" within the series circuit R. At the instant t4, the third memory chip 3c has received the identifier and converted it into its own identifier K3. The last semiconductor memory chip 3n also finally follows this at an instant t5, and finally forwards the memory identifier K4 assigned to it to the second lead 15. The memory identifier signal K4 that is forwarded via the third external terminal 5 indicates to a main board that the memory module is fitted with a total of 4 semiconductor memory chips 3.

Figure 4:
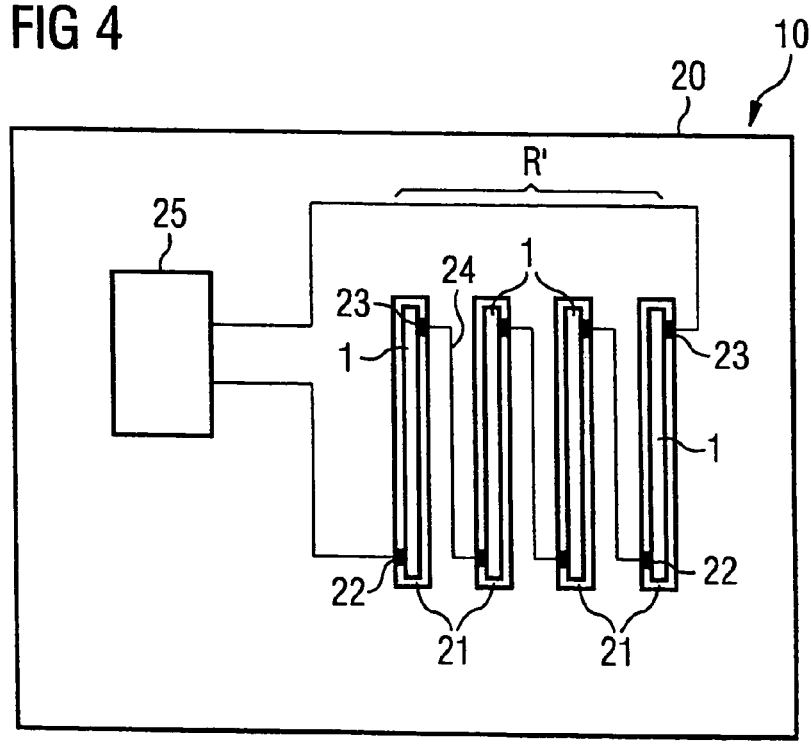
FIG. 4 shows a memory module arrangement according to the invention in accordance with a first embodiment.

FIG. 4 shows a memory module arrangement 10 according to the invention with a main board 20, on which four module slots 21 for a respective memory module 1 according to the invention are provided. There is furthermore provided on the main board 20 a control unit 25, for instance a controller, which has two lines to a contact 22 of a first module slot and to a further contact 23 of a last module slot. Each module slot 21 has in each case two contacts 22, 23 which are connected, with memory module 21, to form each electrical loop which, on each memory module 21, successively traverses a plurality of semiconductor memory chips. On the main board 20, these module-internal series circuits are additionally connected by connection lines 24 to form a cross-memory-module series circuit R'. Consequently, in the exemplary embodiment illustrated in FIG. 4, a cross-module counting-up of all the semiconductor memory chips or their memory areas can be carried out with the aid of the series circuit according to the invention. Changed memory chip arrangements are automatically taken into account even after a rearrangement of memory modules and a renewed start-up.

FIG. 5 shows a further memory module arrangement 10 according to the invention, on the main board 20 of which the memory modules 1 are connected in parallel with one another. For this purpose, two lines proceeding from the controller 25 are in each case arranged per module slot 21, via which lines a chip select signal M3 for selectively driving a specific memory module, that is to say a specific memory-module-internal series circuit R3, is transferred. On account of the specific module identifier, only a single memory-module-internal series circuit of memory chips 3 is addressed, whereas the series circuits R1, R2, R4 of the rest of the memory modules 1, as indicated by line interruptions above the module slots 21, are put into a passive state by the signal M3 for the selection of a specific module or a specific module side. In the embodiment in accordance with FIG. 5, conventional chip select signals M3 can continue to be used without the addition of new signals and can be used for the interrogation of data of individual memory chips 3.

FIG. 6 schematically shows the data transport along a series circuit of a memory module according to an embodiment the invention, as is indicated in FIG. 2 or else in FIG. 5. Data D0 pass from the second external contact 4 of a memory module in the arrow direction to a first memory chip 3a, and from there, since this chip is not selectively selected, in altered fashion via a connection line 18 in the arrow direction to a selected memory chip 3d that is selectively activated by means of a selection signal Q2. On account of the chip-specific interrogation, a changed data set D2 is communicated via the further connection lines 18 in the arrow direction to the rest of the semiconductor memory chips, the changed data D2 preferably containing the original data D0 and supplementary data J, so that a longer data set is read out at the third external contact 5 of the memory module. While a plurality or else all of the memory chips 3a, . . . 3n are driven in a time-delayed manner with respect to one another in a temporally offset manner with respect to one another selectively with respect to in each case the rest of the memory chips, the data set read out by the external contact 5 will in the extreme case contain as many supplementary data sets as the number of memory chips 3a, . . . 3n contained in the series circuit of the memory module. Preferably, for this purpose, the temporal offset from the reading of a data set communicated via a connection line 18 through a specific memory chip up to the forwarding thereof to a further connection line 18 will comply with a time difference that suffices for selectively activating a next memory chip in the series circuit in the meantime.

FIG. 7 shows an example of a flowchart that demonstrates the data transport along the series circuit of memory chips according to the invention, as is illustrated for example in FIGS. 2, 5 and 6. After an input code EC, a command code CC with interrogation commands or other commands is transferred via a module external contact to a first memory module. A device code DC for the specific driving of a specific memory chip will generally follow, which, in the example of FIG. 7, is communicated via the series circuit itself, but may also be communicated via a parallel-branched line 19 as in FIG. 1.

A few optional steps LP, LA and J then follow, which, however, may in each case be circumvented individually and independently of one another, as indicated by detours represented on the right and left of these steps on the basis of FIG. 7. In a section LP of the transferred data, lists of parameters relating to a specific chip are interrogated or input or some other operation relating to such parameters is instigated. Such parameters may be test data of earlier chip tests, as well as for example chip identifiers or codings of the memory capacity. In a next step LA, a list of data that are output is created, and is in each case concomitantly transported in the subsequent part of the series circuit. In a further step J, supplementary data are added, which are forwarded via the remaining part of the series circuit and are read out at the end thereof. The interrogation of the steps LP, LA and/or J may be provided multiply if a plurality of memory chips are individually driven one after the other and in each case additional output lists LA or supplementary data J are appended to the data stream read in. The respective selection of the relevant memory chip occurs by means of device codes DC that are repeatedly attached in the data set and are present at different locations in the data set. This gives rise to the logical loops contained in the flowchart of FIG. 7 between the command code CC and an output code AC.

The entire data sequence illustrated in FIG. 7 between the input code EC and the output code AC contains that data set which is finally output at the end of the series circuit after a single communication of a data set at a first memory chip and the communication to all the rest of the memory chips, if appropriate with the inclusion of changes or additions. Despite the logical loops contained in the flowchart, the read-out of the data set indicated by the flowchart requires only a single interrogation via the module-internal series circuit of the memory chips. A repeated addressing of individual memory chips via the parallel-branched address lines 16 or control lines 17 that are conventionally used for this purpose, in particular the repeated utilization of the lines for the selective driving of a plurality of memory chips, can be obviated according to the invention.

What is claimed is:

1. A memory module comprising:
    a printed circuit board;
    a plurality of semiconductor memory chips mounted on the printed circuit board;
    a plurality of conductive lines electrically coupled to a first set of external contacts of the printed circuit board with the semiconductor memory chips, the conductive lines coupling the semiconductor memory chips in parallel with one another;
    a first connecting line electrically coupled between a second external contact of the printed circuit board and a first semiconductor memory chip, said first connecting line being distinct from said plurality of conductive lines and said second external contact being distinct from said first set of external contacts, the first semiconductor memory chip being one of the plurality of memory chips;
    a second connecting line electrically coupled between a third external contact of the printed circuit board and a second semiconductor memory chip, said second connecting line being distinct from said plurality of conductive lines and said third external contact being distinct from said first set of external contacts, the second memory chip being one of the plurality of memory chips; and
    at least one connection line coupled between ones of the plurality of semiconductor memory chips such that a series circuit is formed between the second external contact and the third external contact, the series circuit traversing through each semiconductor memory chip in the plurality of semiconductor memory chips.

2. The memory module as claimed in claim 1, wherein the series circuit is formed in such a way that data sent to the first semiconductor memory chip via the second external contact are forwarded via the at least one connection line to a respective next semiconductor memory chip of the series circuit.

3. The memory module as claimed in claim 1, and further comprising a third connecting line on said memory module coupled between a fourth external contact of the printed circuit board and each of the plurality of semiconductor memory chips in parallel, wherein the semiconductor memory chips can be activated with the aid of individual memory identifiers individually selectively with respect to further semiconductor memory chips.

4. The memory module as claimed in claim 3, wherein exclusively those semiconductor memory chips including circuitry such that ones of said plurality of semiconductor chips that are selectively activated by a memory identifier carried on the third connecting line alter or supplement data received via the series circuit prior to forwarding the data to a respective next semiconductor memory chip.

5. The memory module as claimed in claim 1, wherein the memory module is configured such that, in the event of a start-up of the memory module, each semiconductor memory chip of the series circuit is assigned an individual memory identifier.

6. The memory module as claimed in claim 5, wherein the individual memory identifier corresponds to a consecutive number of the respective semiconductor memory chip within the series circuit.

7. The memory module as claimed in claim 6, wherein the memory module is configured in such a way that, in the event of each start-up of the memory module, each semiconductor memory chip that receives, via the series circuit, a memory identifier corresponding to its consecutive number within the series circuit further comprising circuits to alter the memory identifiers that is output to the connection line to the respective next semiconductor memory chip corresponding to the next higher consecutive number of a semiconductor memory chip.

8. The memory module as claimed in claim 1, wherein the plurality of conductive lines comprise address lines and control lines.

9. The memory module as claimed in claim 1, wherein the semiconductor memory chips comprise volatile random access memories.

10. The memory module as claimed in claim 1, wherein the first set of external contacts and the second and the third external contacts are arranged in a common contact bank of the printed circuit board.

11. A memory system comprising:
- a main board having a plurality of module slots, each module slot having a first contact, a second contact and a third contact;
- a memory controller connected to the main board; and
- a memory module connected to one of the module slow, the memory module comprising:
  - a printed circuit board;
  - a plurality of semiconductor memory chips mounted on the printed circuit board;
  - a plurality of conductive lines electrically coupled to a first set of external contacts of the printed circuit board with the semiconductor memory chips, the conductive lines coupling the semiconductor memory chips in parallel with one another;
  - a first connecting line electrically coupled between a second external contact of the printed circuit board and a first semiconductor memory chip, said first connecting line being distinct from said plurality of conductive lines and said second external contact being distinct from said first set of external contacts, the first semiconductor memory chip being one of the plurality of memory chips and the second external contact being electrically coupled to the second contact of the one of the module slots;
  - a second connecting line electrically coupled between a third external contact of the printed circuit board and a second semiconductor memory chip, said second connecting line being distinct from said plurality of conductive lines and said third external contact being distinct from said first set of external contacts, the second memory chip being one of the plurality of memory chips and the third external contact being electrically coupled to the third contact of the one of the module slots; and
  - at least one connection line coupled between ones of the plurality of semiconductor memory chips such that a series circuit is formed between the second external contact and the third external contact, the series circuit traversing through each semiconductor memory chip in the plurality of semiconductor memory chips.

12. The memory system as claimed in claim 11, further comprising a second memory module connected to a second one of the memory slots.

13. The memory system as claimed in claim 12, wherein the main board is constructed in such a way that the semiconductor memory chips of each of the semiconductor memory modules connected to the module slots are connected to form a single series circuit via the second and third contacts of the module slots.

14. The memory module arrangement as claimed in claim 11, wherein the main board is constructed in such a way that, with the aid of a module identification, a respective series circuit of semiconductor memory chips of one memory module can be driven selectively with respect to series circuits of semiconductor memory chips of further memory modules.

* * * * *

UNITED STATES PATENT AND TRADEMARK OFFICE
CERTIFICATE OF CORRECTION

| | | |
|---|---|---|
| PATENT NO. | : 7,202,545 B2 | Page 1 of 1 |
| APPLICATION NO. | : 10/928708 | |
| DATED | : April 10, 2007 | |
| INVENTOR(S) | : Perner | |

It is certified that error appears in the above-identified patent and that said Letters Patent is hereby corrected as shown below:

On the title page item (56), Col. 2, line 1, References Cited delete "5,357,621" insert --5,537,621--

Signed and Sealed this

Nineteenth Day of June, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,202,545 B2 |
| APPLICATION NO. | : 10/928708 |
| DATED | : April 10, 2007 |
| INVENTOR(S) | : Martin Perner |

It is certified that error appears in the above-identified patent and that said Letters Patent is hereby corrected as shown below:

<u>Title Page,</u>
Item [56] References Cited, Col. 2, line 1, U.S. patent citation "5,357,621", (corrected to read "5,537,621" by Certificate of Correction issued June 19, 2007) should be reinstated.

Signed and Sealed this

Sixth Day of November, 2007

JON W. DUDAS
*Director of the United States Patent and Trademark Office*